United States Patent
Parthier et al.

(10) Patent No.: US 7,968,074 B2
(45) Date of Patent: *Jun. 28, 2011

(54) METHOD FOR MAKING LOW-STRESS LARGE-VOLUME CRYSTALS WITH REDUCED STRESS BIREFRINGENCE AND MORE UNIFORM REFRACTIVE INDEX AND CRYSTALS MADE THEREBY

(75) Inventors: Lutz Parthier, Kleinmachnow (DE); Joerg Staeblein, Jena (DE); Gunther Wehrhan, Jena (DE); Christian Kusch, München (DE)

(73) Assignee: Hellma Materials GmbH & Co. KG, Jena (DE)

( * ) Notice: Subject to any disclaimer, the term of this patent is extended or adjusted under 35 U.S.C. 154(b) by 1062 days.

This patent is subject to a terminal disclaimer.

(21) Appl. No.: 11/062,712

(22) Filed: Feb. 22, 2005

(65) Prior Publication Data

US 2005/0204999 A1    Sep. 22, 2005

(30) Foreign Application Priority Data

Feb. 23, 2004 (DE) .................. 10 2004 008 753

(51) Int. Cl.
*C01B 7/19* (2006.01)
*C01B 9/00* (2006.01)
*C30B 33/02* (2006.01)

(52) U.S. Cl. .......... 423/462; 423/489; 423/490; 117/73; 117/2; 117/3; 117/4

(58) Field of Classification Search .............. 423/462, 423/489, 490; 117/73, 2, 3, 4
See application file for complete search history.

(56) References Cited

U.S. PATENT DOCUMENTS

| 6,332,922 B1 | 12/2001 | Sakuma et al. |
| 6,364,946 B2 | 4/2002 | Staeblein et al. |
| 6,624,390 B1 | 9/2003 | Motakef et al. |
| 6,969,502 B2 * | 11/2005 | Wehrhan et al. ............ 423/328.2 |
| 7,534,412 B2 * | 5/2009 | Ortmann et al. .............. 423/490 |
| 2002/0020338 A1 | 2/2002 | Oba et al. |
| 2002/0038625 A1 | 4/2002 | Sakuma et al. |
| 2002/0182863 A1 | 12/2002 | Chiba |

(Continued)

FOREIGN PATENT DOCUMENTS

DE         213 514         9/1984

(Continued)

OTHER PUBLICATIONS

Technical Information Advanced Optics, TIE-26: Homogenety of Optical Glass, Jul. 2004 (In English).

(Continued)

*Primary Examiner* — Matthew J Song
(74) *Attorney, Agent, or Firm* — Michael J. Striker

(57) ABSTRACT

The method produces low-stress, large-volume crystals with low birefringence and uniform index of refraction. The method includes growing the crystal with larger than desired dimensions including diameter and height from a melt; cooling and tempering the crystal with the larger than desired dimensions and after the cooling and tempering removing edge regions of the crystal with the larger than desired dimensions so that a diameter reduction and a height reduction of at least five percent occurs respectively and so that the crystal has the desired dimensions of diameter and height. No further tempering takes place after removing of the edge regions.

22 Claims, 2 Drawing Sheets

U.S. PATENT DOCUMENTS

| | | |
|---|---|---|
| 2003/0089307 A1* | 5/2003 | Wehrhan et al. ............. 117/200 |
| 2004/0005266 A1 | 1/2004 | Sakuma et al. |
| 2004/0016743 A1* | 1/2004 | Motakef et al. ............... 219/385 |
| 2004/0099205 A1 | 5/2004 | Li et al. |
| 2004/0154527 A1 | 8/2004 | Li et al. |
| 2005/0183659 A1* | 8/2005 | Staeblein et al. ................. 117/3 |
| 2005/0211160 A1* | 9/2005 | Ortmann et al. ................ 117/81 |
| 2007/0251443 A1* | 11/2007 | Parthier et al. .................... 117/3 |

FOREIGN PATENT DOCUMENTS

| | | |
|---|---|---|
| DE | 100 10 484 A1 | 9/2001 |
| DE | 100 10 485 | 9/2001 |
| DE | 10 2004 003 831 | 7/2004 |
| EP | 0 939 147 | 9/1999 |
| EP | 0 942 297 | 9/1999 |
| EP | 0 972 863 | 1/2000 |
| EP | 0 995 820 | 4/2000 |
| EP | 1 234 898 A1 | 8/2002 |
| JP | 10251096 | 9/1998 |
| JP | 2001335398 | 12/2001 |
| JP | 2003-327499 | 11/2003 |

OTHER PUBLICATIONS

Metrology: Homogenety of Refractive Index; Stress Birefringence Retardation, Mar. 25, 2010 (In English).

* cited by examiner

US 7,968,074 B2

METHOD FOR MAKING LOW-STRESS LARGE-VOLUME CRYSTALS WITH REDUCED STRESS BIREFRINGENCE AND MORE UNIFORM REFRACTIVE INDEX AND CRYSTALS MADE THEREBY

BACKGROUND OF THE INVENTION

1. Field of the Invention

The present invention relates to methods of making low-stress, large-volume crystals, which have reduced birefringence over their volume and a uniform index of refraction, by means of a specially directed tempering. The invention also relates to the crystals made by the method, to optical elements made from the crystals and generally to uses of the crystals made by the method.

2. Related Art

There is an ever-increasing need for crystals, especially single crystals, for lenses and optical systems, also for wavelengths outside of the visible range. For example, lasers generating laser beams at wavelengths in the far UV range (DUV), especially at wavelengths below 250 nm, especially at 248 nm, 193 nm and/or 157 nm, are used in methods of making computer chips by means of microlithography. Large-sized single crystals are used as optical elements and/or lenses in illuminating and imaging optics at 193 nm and preferably at 157 nm. $CaF_2$ has been used as a preferred material for this purpose. Optics for manufacture of integrated circuits, e.g. computer chips, must have the smallest possible structural defects, i.e. sharp imaging, in order to obtain a perfect product. In order to attain the required image quality, very high specifications are established for the optical base material, i.e. the crystal. Thus the index of refraction n must be as uniform as possible, i.e. its variation in the lens blank should not be more than $1*10^{-6}$ and the stress birefringence should be definitely under 1 nm/cm.

The stress optical tensor gives the connection between the mechanical variables (such as stress) and the optical effects caused by them (such as the stress birefringence SDB) in crystals (direction-dependent). That means that stresses of equal magnitude in single crystal material can lead to clearly different stress birefringence and non-uniformities in the index of refraction depending on the crystallographic orientation and/or the observation direction. For these reasons up to now components were used, in which the minimal stress birefringence is obtained in the application or use direction. For calcium fluoride crystals that direction is the (111) direction. Thus currently materials for lens blanks are used exclusively in the (111) orientation (and/or near the (111) direction for cubes).

A number of methods for making large-volume single crystals are known in the art. For example DE-A 100 10 484 describes an apparatus for growing large-volume single crystals. This reference also describes a method for tempering this sort of crystal to reduce the stress birefringence. In this method usually the method starts with crystals with an average stress birefringence (RMS value) of about 5 to 20 nm/cm prior to tempering. The described method may reduce the stress birefringence in the crystals to 1 nm/cm and reduces the refractive index variations so that the refractive index does not vary by more than $\Delta n=5*10^{-6}$ within the crystal. After being grown the crystal is placed in a tempering oven and heated for at least two hours above 1150° C. in the presence of a $CaF_2$ powder reducing the evaporation from the crystal. Also a tempering process is described in DD-PS 213,514, in which a $CaF_2$ crystal is heated in a $PbF_2$ containing atmosphere at a temperature of 1200° C. In this tempering process stress birefringence of 10 to 25 nm/cm (RMS value), which is present in the crystal, is reduced to only 1 nm/cm by heating for 2 to 3 hours at 1200° C.

In JP-A 2001-335 398 a tempering method for reducing stress birefringence and including uniformity of refractive index is described, in which the crystal is first heated in a range from 1020 to 1150° C. for a predetermined time and is cooled with a cooling rate of 1° C. per hour, then to a temperature under 700° C.

In JP-A 10-251 096 a procedure is described in which the crystal is first cut to the dimensions of the final product and subsequently a tempering process is performed.

Crystals with the smallest possible dimensions must be tempered based on theoretical considerations regarding the relationships between the dimensions of the crystal body, such as diameter and thickness, and the stresses producing the stress birefringence occurring in the material. Since the temperature differences $\Delta T$ producing stress produced by heating and/or cooling between different locations in the crystal are proportional to the square of the thickness and/or height, h, of the crystal and the square of the diameter, d, of the crystal disk, i.e. $\Delta T \sim d^2$ and $\Delta T \sim h^2$, crystals with the smallest possible volume are to be tempered. An increase in the diameter and/or the height or thickness of the crystal body during tempering causes an increase in the stress birefringence, other conditions being equal.

During tempering a nearly complete elimination of the stresses present in the crystal occurs by a plastic deformation of the crystal lattice by activation of glide processes along a glide system predetermined by the respective structure of the crystal lattice and by atomic diffusion mechanisms (cascade processes). Thus it is necessary that the tempering or annealing temperature is as high as possible, in order to obtain a crystal in which the defects are minimized throughout its entire crystalline volume. Generally the higher the temperature, the less the residual stress. However the crystal must be given sufficient time for the desired glide and diffusion processes to occur. During the entire tempering process comprising the heat-up stage, the holding stage when the temperature is held at a maximum value and the cooling stage, an extremely uniform temperature distribution must be guaranteed throughout the entire crystal volume.

The spatial temperature distribution throughout the entire crystal volume results from an overlap of a static temperature gradient (apparatus dependent temperature distribution) with a dynamic temperature gradient, which arises because of the heating up and cooling down of the crystal. The former gradiens dominates the holding time, the latter comes into play during the heat up and cool down of the crystal. Based on those considerations currently the orientation of the crystal in the temperature field is considered irrelevant for the tempering results, since the volume at the maximum temperature (holding temperature) is essentially in a more uniform static temperature field than that in the heat up stage or the cooling down stage.

In order to keep the crystal structure produced by the tempering more or less stress-free, it is cooled in such manner that no temperature gradient, which produces new stresses in the crystal, is produced. It has been shown that stresses in materials first lead to elastic and later to plastic deformation when a critical value is exceeded.

SUMMARY OF THE INVENTION

It is an object of the present invention to provide crystals, especially for optical elements, which have a greatly improved stress birefringence and a high uniformity of refractive index over their entire crystal volume.

This object is achieved by the method defined in the appended claims.

According to the invention it was found that not only the greatest stress birefringence occurs in the crystalline material at the edges of the crystal but that the stress birefringence and stress-dependent refractive index differences occurring within the crystal can be more or less completely removed by removing or taking off the edge regions of the crystal after tempering. According to the invention it was similarly also found that this is based on elastic residual stresses, which can be substantially completely relaxed by removal of the tension- or stress-exerting edges of the crystal.

According to the invention an oriented blank is cut out of a raw crystal, which is substantially oversized in comparison to that of the prior art. This oversized blank is then tempered in an oven and/or other apparatus suitable for this purpose. The excess crystalline material is then removed after tempering. Preferably the excessive height and diameter is reduced by removing excess material along the periphery and/or outer edges from the crystal center portion. In a preferred embodiment the increase of the oversized dimensions in relation to the final dimensions of the crystal amounts to at least 5%, preferably 10%, of the final dimensions. An increase in dimensions of 15%, and especially of 20%, is even more preferable. An increase of 25 or 30% is most preferred. The increase in dimensions preferably relates to the diameter and/or height of the crystal. For example, should the final dimension of the finished crystal be 20 cm, the crystal that is tempered should have a 20% increase in this dimension, e.g. it should have a diameter of at least 24 cm. The later tempering of the crystal after removal of the edge regions, which produces interior elastic residual stress in the crystal, should not take place.

Surprisingly it has been shown that oriented blanks obtained by this method have an RMS value of the refractive index uniformity of better than $0.025 \times 10^{-6}$, especially better than $0.015 \times 10^{-6}$. These uniformity values are achieved in the 111, 110 and/or 100 orientation. Values of the stress birefringence (SDB) in nm/cm are listed in the following Table I.

TABLE I

STRESS BIREFRINGENCE (in nm/cm) VERSUS ORIENTATION

| | <111>-orientation, preferred | <111>-orientation, especially preferred | <100> or <110>-orientation, preferred | <100> or <110>-orientation, especially preferred |
|---|---|---|---|---|
| SDB-PV value | 0.5 | 0.2 | 2.5 | 1 |
| SDB-RMS value | 0.15 | 0.08 | 1 | 0.35 |

The method according to the invention is suitable for making crystals of all shapes and all orientations. Thus, for example, without more it is possible to obtain crystals in the (100)- or (110)-orientation instead of in the (111)-orientation, which are approximately stress-free, which was not possible up to now with the prior art methods.

The crystals according to the invention can be made by known methods according to the so-called gradient solidification methods (gradient solidification methods GSM). Furthermore methods of making them on an industrial scale include, for example, the Bridgman-Stockbarger method, the Vertical Gradient Freeze method, the Neck Kyropoulos method and the Czochralski method. In these methods polycrystalline material is melted in a vessel or crucible and subsequently the melt is slowly allowed to solidify in a directed manner, preferably by means of a seed crystal. Subsequently slow cooling takes place in all these methods in order to obtain crystals with already small thermal stresses. All the crystals obtained in this method are suitable for the method according to the invention.

The tempering itself is preferably performed at a temperature above 1000° C. During the tempering the crystal is preferably heated to a uniform temperature over its entire volume, i.e. no temperature gradient is present and relaxation processes are occurring in the crystal.

According to the invention as uniform as possible a temperature is present in the crystal during tempering and/or during gettering with a scavenger. This means that the temperature does not usually vary by more than 5° C. from the uniform temperature at any point in the tempering chamber, especially no more than 2° C. and preferably no more than 1° C.

It has been shown that the crystal defects in $CaF_2$ may be further reduced sufficiently to reach the above-described goals, when the crystal is heated to a temperature above 1000° C. and is held at the set temperature for at least 65 hours, preferably at least 75 hours. However 80 hours is especially preferred. According to the invention it was found that a clearly extended time interval is required compared to currently known processes opposite to the current ideas, in order to permit the required relaxation process to run in the crystal.

The set holding temperature during tempering amounts according to the invention to at least 1000° C., preferably at least 1050° C., wherein at least 1080° C. and/or 1100° C. are especially preferred. A tempering above 1200° C. is particularly preferred, tempering over 1210° C. is even more particularly preferred. The upper temperature limit during tempering should not exceed 1415° C., preferably 1370° C. An upper temperature limiting value of at most 1360° C. is preferred, but a value of 1350° C. is particular preferred. Suitable upper temperature limits during tempering amount to at most 1300° C., but a maximum temperature of 1250° C. and/or 1200° C. is sufficient in most cases. According to the invention it has also proven advantageous that there are no or only minimal temperature differences from place to place in the crystal during the holding time interval, i.e. the temperature is kept as uniform as possible through the entire crystal volume during the holding stage.

The extreme requirements for freedom from stress in the crystal are especially fulfilled when the dynamic temperature gradients during the heat up stage, and to the extent that it is still essentially significant during the cool down stage, are reduced so that they are of a size that is not more significant or substantial than the statistical temperature gradients during the holding time interval at maximum temperature.

Preferably the healing or annealing process runs in an apparatus, which guarantees a statistical radial temperature gradient of less than 0.013 K/cm and an axial temperature gradient of less than 0.07 K/cm in the region, in which the material to be tempered is found.

It has proven suitable to first heat to a temperature of 350° C. to 600° C., especially 350° C. to 500° C., during tempering, in order to remove residual moisture from the surface of the calcium fluoride crystal and water introduced during storage. A heating of 350° C. to 400° C. is especially preferred. This preferably happens under vacuum. The water drying time usually amounts to from 12 to 45 hours, preferably 24 hours.

During the heat up stage heating rates are set less than 18 K/h according to the invention, preferably less than 12 K/h, but heating rates of less than 10 K/h are especially preferred.

According to the invention it has now been found that small heating rates are essential in order to achieve good tempering results. It has been shown namely that during the heat up defects generated in the case of blanks that are not (111)-oriented are essentially more troublesome in the final product and are also essentially more difficult to relax (during the holding time).

According to the invention cooling rates are maintained, which amount to less than 0.5 K/h, preferably less than 0.4 K/h, and especially preferably less than 0.3 K/h, in the upper temperature range of the cooling stage and can be increased in a lower temperature range of the cooling stage.

The increase of the cooling rates in the lower temperature range is desirable and also possible, in order to not unnecessarily increase the processing time and associated costs.

The increase of the cooling rate can occur in a single step, but preferably occurs in several steps. The temperature rates in the lower temperature range may not be increased over 3 K/h, preferably not over 2 K/h, and especially preferably not over 1.7 K/h, according to the invention.

The limiting temperature that separates the upper from the lower temperature range of the cooling stage is in a range between 900° C. and 600° C. The higher the quality requirements for the product, the lower the transition temperature.

The apparatus should preferably be made exclusively from highly pure graphite in its interior, in order to prevent contamination of the $CaF_2$ crystals, which can lead to a reduction of transmission.

The purity requirements likewise extend to the products to be tempered. Thus prior to coating the apparatus the parts are subjected to a careful purification. The parts should be both fat-free and dust-free, and have no surface moisture or as little surface moisture as possible. A purification of the parts with fat-dissolving organic solvent at high vapor pressure is preferred. After a successful purification contact with the parts with bare skin or dirty objects is to be avoided.

It has also proven to be appropriate to perform tempering under a protective gas. The conventional protective gases are nitrogen, helium, argon and/or xenon.

At least one scavenger material is preferably used to remove the residual oxygen present in the apparatus, on the crystal surfaces and/or in the crystal lattice. Compounds, such as $ZnF_2$, $PbF_2$, $XeF_2$ and $SnF_2$, which are used as solids, have proven to be suitable. It is also possible to use a gaseous scavenger after a drying stage. Especially fluorine gas, fluorine gas/inert gas mixture, fluorocarbon gases and/or fluorohydrocarbon gas are preferable for use as gaseous scavengers. A combination of solid and gaseous scavengers can also be used.

In a preferred embodiment the tempering is performed using a gaseous scavenger. For example, $CF_4$, $C_2F_6$, $C_3F_8$ or $CHF_3$, $SF_6$ or $NF_3$ are preferred with the use of fluorocarbon gases, which are mixed in a concentration of 1 to 50%, especially 5 to 30%, and more preferably 5 to 15%, with an inert gas to form a preferred scavenger gas in the apparatus. Surprisingly the transmission of the $CaF_2$ is increased by the use of these gases. This effect is not achieved using inert gas, vacuum or powdery scavenger material.

In an especially preferred embodiment the tempering is performed in a fluorine-containing atmosphere, especially a fluorine-containing protective gas. Herein fluorine gas is conducted into a tempering oven and/or tempering vessel containing the tempering material, or released by vaporization. Additional suitable reactive fluorine gases are tetrafluoromethane and other fluorocarbon material or fluorohydrocarbon materials.

An HF atmosphere is an especially preferred fluorine-containing atmosphere. In another preferred embodiment according to the invention the fluorine-containing atmosphere is used together with a protective gas. The gas mixture arising thereby appropriately contains from 0.1 to 20% fluorine gas, especially from 1 to 10%. An especially preferred mixture is a mixture of HF and $N_2$.

A fluorine-containing atmosphere provided by a fluorine-releasing solid body, such as $XeF_2$, is an entirely special preferred embodiment. $XeF_2$ is a solid at room temperature, which decomposes at temperatures above 400° C. to Xe and $F_2$ gas. It is appropriate to use $XeF_2$ enclosed in an airtight TEFLON® bag.

It has also proven to be appropriate that the tempering is performed in a reducing atmosphere. A reducing atmosphere for example is obtained by addition of graphite powder, which reacts with water to form $CO/CO_2$ and $CH_4$. $CH_4$ itself has a reducing effective. Also the partially gaseous lead fluoride has a reducing oxygen-removing effect against calcium oxide. In this way calcium oxide present in calcium fluoride crystals or arising by reaction with water can be converted to calcium fluoride, which serves for deposit formation and also reduction of small angle grain boundaries.

In an especial preferred embodiment a gas mixture for temperature with the above-described composition may flow through the apparatus with a flow rate of a few liters per minute during the tempering stage.

Special care regarding purity and freedom from oxygen of all materials and surfaces found in the apparatus can be left to the scavenger material. First drying is performed in a high vacuum in order to completely remove surface water and oxygen. The tempering can occur in vacuum, but also in an inert gas atmosphere.

It has also proven suitable to maintain a calcium fluoride partial pressure of 0.7 to 1.5 mbar, especially 0.8 to 1 mbar, in the tempering vessel containing the tempering material. This is preferably achieved by addition of $CaF_2$ powder as the tempering powder. The tempering vessel, which is usually built into a suitably evacuated tempering oven, is preferably formed so that it is not gas-tight. The transport of gases from the interior of the tempering vessel is only hindered, but not prevented. The extent of the hindering of the transport of gas is arranged so that the water removed from the surface of the tempering material and/or the tempering vessel and/or the gas removed can escape sufficiently into the space outside of the tempering vessel during a drying phase with temperatures between 350° C. to 600° C., preferably from 350° C. to 500° C. and especially preferably from 350° C. to 400° C. The same goes for the conduction and transport of protective gas and/or gaseous scavenger material. In the upper temperature range (higher than 600° C.) the form of the tempering vessel should guarantee that the above-described partial pressure of $CaF_2$ is maintained and, in the case of a solid scavenger, that the scavenger partial pressure determined by the type of scavenger, the temperature range and the given amount of scavenger is maintained. A quasi-stationary state exists over the wide temperature range for the defined material because of that, as long as sufficient tempering powder, scavenger powder and/or protective and/or fluorine gas is present.

Preferably a finely divided calcium fluoride powder with an average grain size of 100 nm to 1 mm is used during tempering. Typical average grain sizes amount to 1 to 200 μm, preferably 5 to 100 μm, and especially 10 to 50 μm. The surface area of the finely divided calcium fluoride powder should be at least 10 times, preferably at least 100 times, the surface area of the material to be tempered. In an especially preferred embodiment the powder has at least a thousand times, in many cases at least 5,000 times and even 10,000 times, the surface area of the tempering material.

It is particularly preferred to embed the crystals to be tempered and the finished optics directly in the tempering powder, so that they have direct contact with the powder. It has proven appropriate to remove sufficiently troubling impurities in this way.

The calcium fluoride powder preferably contains at least one scavenger for removing oxygen present in the crystal structure. Preferred scavengers include $PbF_2$, $ZnF_2$, $SnF_2$, graphite and other low melting fluorides and/or fluoride compounds, which react into volatile compounds with oxygen. $XeF_2$ is an additional preferred scavenger, which is solid at room temperature, however decomposes on heating to form Xe gas and $F_2$ gas and thus acts as a low temperature scavenger. The preferred grain sizes of the scavenger correspond to that of the $CaF_2$ powder, however they can differ from that of the $CaF_2$ powder.

In an especially preferred embodiment the powder used for tempering contains finely divided hydrocarbons, especially graphite.

Preferably the heat supply occurs laterally to the crystal being tempered and independently of the length of the diffusion path and independently of the ratio of diameter to height. Principally the heat supply can occur also through the upper and lower surface of the crystalline body. In a further preferred embodiment the surface, through which the heat is supplied, and/or the surface, through which no heat is supplied, is covered. Preferred covers are graphite mats or graphite plates. Graphite plates assist in reducing the temperature gradient in the tempering material, since a uniform heat supply and removal is required in and/or from the crystal. The graphite covers should have sufficient heat conductivity.

The crystal materials within the scope of the present invention include all alkali fluorides and alkaline earth fluorides, such as $CaF_2$, $BaF_2$, $SrF_2$, $MgF_2$ as well as NaF, LiF and KF. Also crystals of mixed fluorides are suitable according to the invention.

The invention not only concerns a method, but also the stress-poor crystals, which have a very uniform index of refraction, made by the method. The crystals according to the invention have the above-described properties, especially optical properties.

The invention also relates of the use of the crystals obtained by the method for optical purposes, especially as blanks and/or half-finished articles for optical elements. Microlithography, usually microlithography at <250 nm, especially at 248 nm and/or at 193 nm and preferably at 157 nm, is a preferred application of the crystals obtained by the method according to the invention.

The optical elements obtained according to the invention especially include prisms and lenses, which are used in optical arrangements, especially objectives. When they are used in microlithography and photography, generally steppers, excimer lasers, wafers and computer chips are made with them, as well as integrated circuits and electronic devices, which should contain those circuits and electronic devices.

The following examples are illustrative of the methods according to the invention but should not be considered to limit the appended claims.

EXAMPLES

Calcium fluoride crystals were made by the following procedure. Highly pure synthetically produced $CaF_2$ powder is mixed with a scavenger (e.g. $ZnF_2$ or $PbF_2$). The mixture is introduced in portions of 30 to 60 kg into graphite vessels, which are subjected individually or simultaneously to a crystal growth process under vacuum in an oven. This crystal growth process typically comprises a drying stage, in which water and gasses are removed from the surface and from the pores; a scavenger stage, in which still remaining oxygen is removed; a homogenizing stage, in whose course volatile impurities can be evaporated and whose result is the complete homogenizing of the melting $CaF_2$ present, and a crystallization stage, in which the crystal rapidly solidifies in an oriented or non-oriented manner. Several of these pre-products arising are used to perform a re-crystallization growth process, either completely or after removal of the typically most strongly contaminated covering and edge regions. Several of these pre-products or their parts are used in a total amount of 100 to 200 kg and a reduced amount of less than three percent scavenger in a vessel of 300 to 500 mm diameter. The growth process now beginning can either be performed according to the Bridgemann-Stockbarger method or the Vertical Gradient Freeze technology. The use of a crystal seed, which guarantees the growth of a single crystal from the bottom of the vessel upward, is important. It is decisive for the success of the tempering process according to the invention that the single crystal is grown very slowly (typically with a growth rate of less than 2 mm/h) and is rapidly cooled to room temperature differently in different temperature ranges after shut off the growth process, but never faster than 10 K/h. In this manner a sufficiently good raw crystal is obtained, which already has an average stress birefringence of about 5 to 20 nm/cm (RMS value) prior to tempering.

A (100)-oriented disk with a diameter of 270 mm is cut out of the crystal obtained by the foregoing procedure.

This disk was subsequently tempered. First the residual moisture was removed at a temperature of 370° C. within 24 h in a high vacuum. Subsequently the disk was placed in a nitrogen protective gas atmosphere with a pressure of 15 mbar. $ZnF_2$ was used as scavenger material and about 500 g $CaF_2$ powder was added. The disk was heated up to 1170° C. at a temperature increase rate of 13 K/h and maintained at this temperature for 75 h. Cooling occurred with a cooling rate of 0.28 K/h to 920° C., with a cooling rate of 0.42 K/h to 700° C./h and with 0.8 K/h to room temperature.

Subsequently the stress birefringence (SDB) and the index of refraction along the surface were determined. In that determination the disk surface was scanned at intervals of 2 mm over the test diameter and the average value (RMS value) was determined from these individual values. Subsequently the outer edge region was removed and of course to an outer diameter of 252 mm, and the SDB was determined again as before. This procedure was repeated with reduced diameters of 234 mm, 216 mm and 207 mm. As shown in the following Table II, elastic stresses present within the crystal are removed because of the reduction in the diameter. For a crystal disk of 270 nm a stress birefringence of 1.489 nm/cm in an interior circle of diameter dd=150 mm is reduced to 1.022 nm/cm, after the diameter of 270 mm was reduced to 207 mm. This means an improvement to 69% of the previous value. The average stress birefringence (SDB) of 1.489 nm/cm within an interior circle of diameter dd=170 mm decreases to 1.047 nm/cm, which amounts to a decrease to 70%. Considering that these values were measured in a crystal along an optic axis in a 100 direction, the importance of the method according to the present invention may be judged from that, since oriented crystals with this sort of orientation, which are currently hardly stress-free, were made by prior art methods.

TABLE II

RMS-AVERAGE STRESS BIREFRINGENCE VALUES (in nm/cm) AND PERCENT SBD REDUCTIONS (in %) AS A FUNCTION OF BLANK DIAMETERS d (in mm) WITHIN AN INTERIOR CIRCLE OF DIAMETER, dd

| Disk diameter, d | dd = 150 mm SBD, nm/cm | dd = 150 mm % | dd = 170 mm SBD, nm/cm | dd = 170 mm % | dd = 200 mm SBD, nm/cm | dd = 200 mm % | dd = 220 mm SBD, nm/cm | dd = 220 mm % |
|---|---|---|---|---|---|---|---|---|
| 270 | 1.489 | 100 | 1.489 | 100 | 1.490 | 100 | 1.896 | 100 |
| 252 | 1.408 | 95 | 1.421 | 95 | 1.466 | 98 | 1.959 | 103 |
| 234 | 1.237 | 83 | 1.239 | 83 | 1.274 | 86 | 1.802 | 95 |
| 216 | 1.071 | 72 | 1.080 | 73 | 1.148 | | | |
| 207 | 1.022 | 69 | 1.047 | 70 | 1.161 | | | |

BRIEF DESCRIPTION OF THE DRAWING

The objects, features and advantages of the invention will now be illustrated in more detail with the aid of the following description of the accompanying figures, in which.

Figure 1:
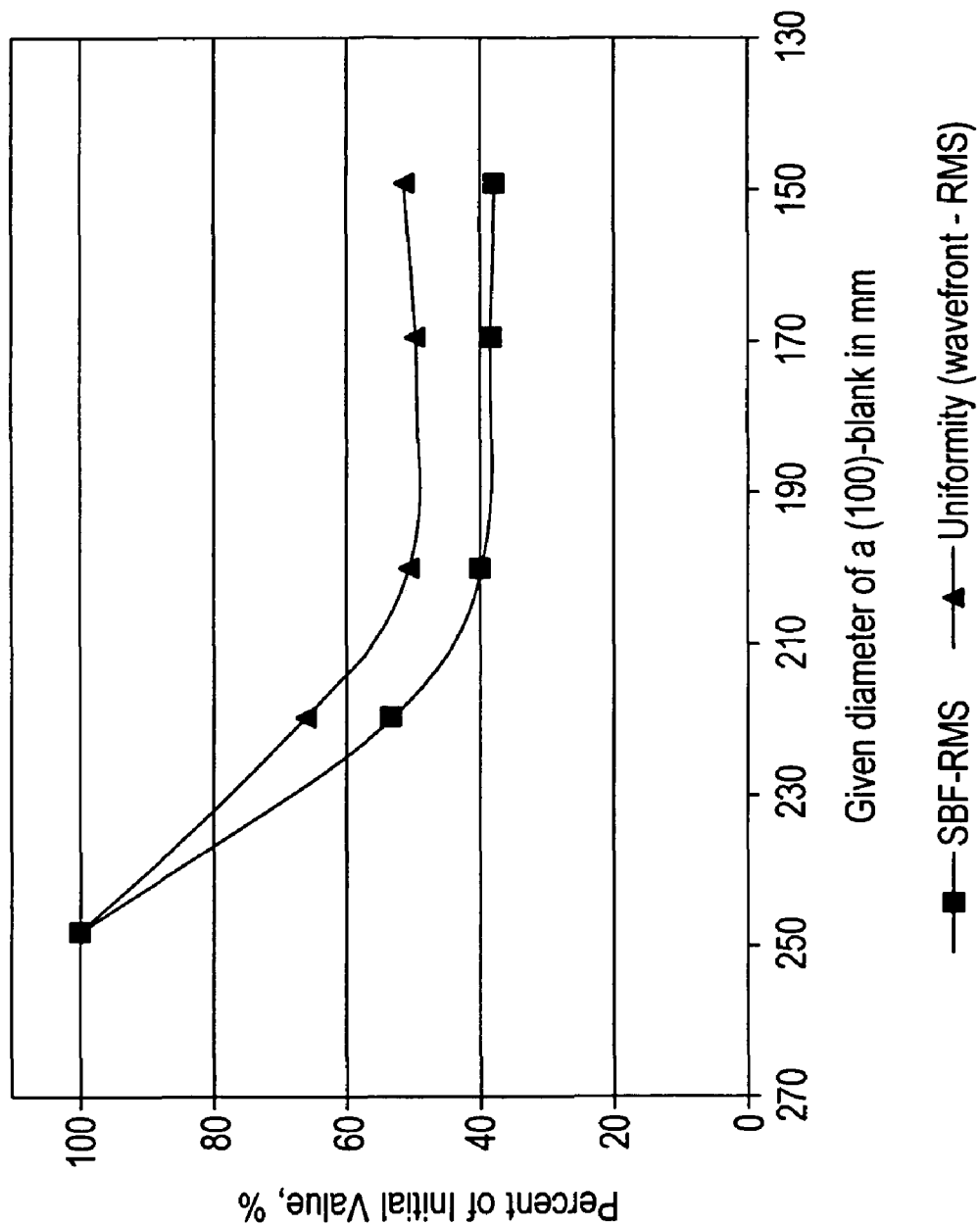
FIG. 1 is a graphical illustration of the variation in the index of refraction and the uniformity as a function of diameter of a (100)-blank for reduced diameter blanks (blank diameter=280 mm)

Measurement of the uniformity of the refractive index exhibits the same sort of effect according to the invention, as shown by the graphical illustration in FIG. 1.

Figure 2:
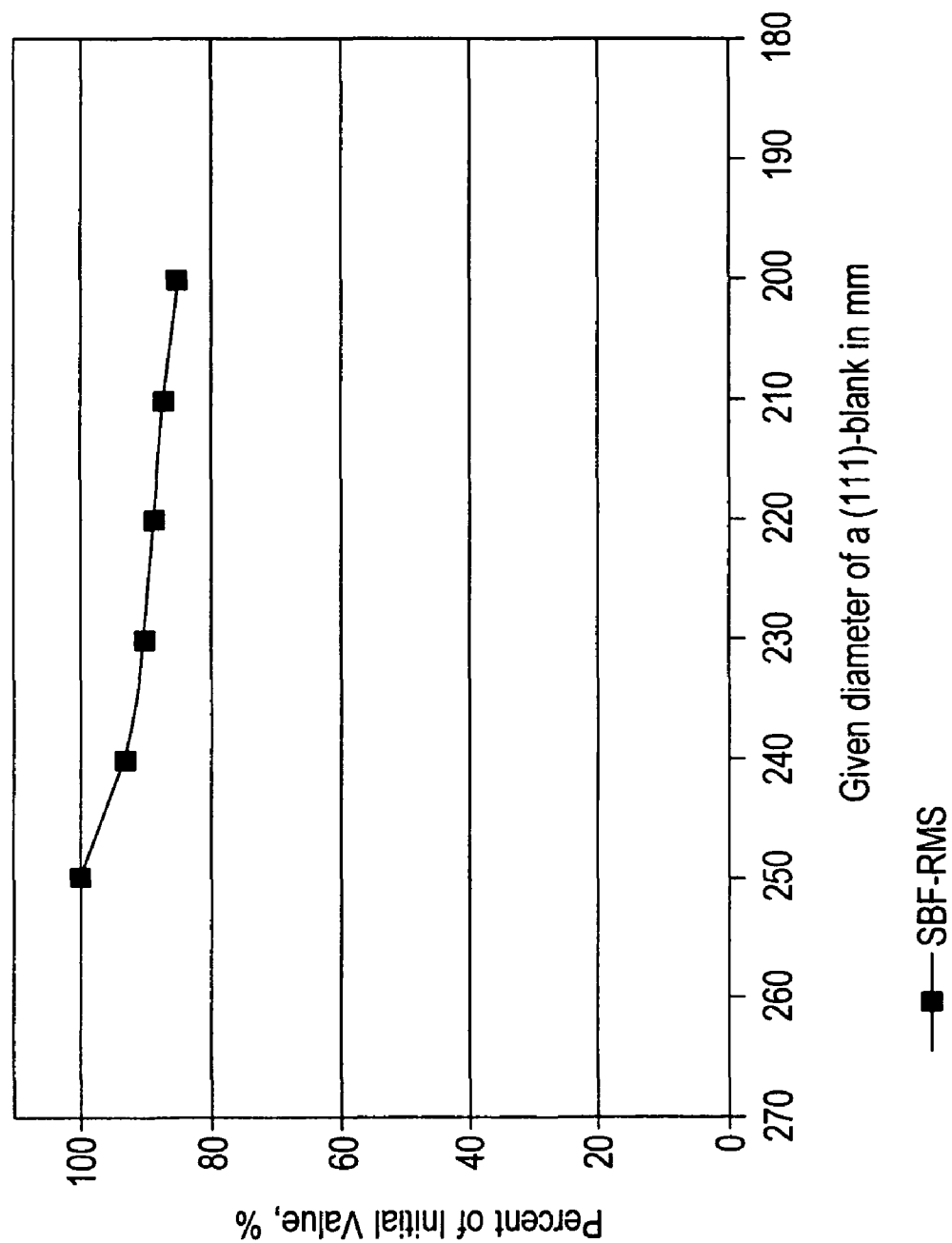
FIG. 2 is a graphical illustration of the variation in refractive index as a function of diameter of a (111)-blank (blank diameter=278 mm).

This effect according to the invention is also pronounced in crystal disks, which are irradiated along their 111-direction or orientation. These latter results are shown in FIG. 2.

The disclosure in German Patent Application 10 2004 008 753.9 of Feb. 23, 2004 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a method for making large-volume crystals with reduced stress birefringence and more uniform refractive index and crystals made thereby, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A method of making a low-stress, large-volume crystal with predetermined dimensions defined by a diameter and a height of the crystal, said crystal having a low birefringence and a uniform refractive index, said method comprising the steps of:
    a) growing an alkali fluoride, alkaline earth fluoride or a mixed fluoride crystal with larger dimensions than said predetermined dimensions from a melt;
    b) cooling the crystal with the larger dimensions obtained in step a);
    c) tempering the crystal with the larger dimensions obtained In step a); and
    d) after the cooling of step b) and the tempering of step c), removing edge regions of said crystal with the larger dimensions so that a diameter reduction and a height reduction of at least five percent occurs respectively and thus said crystal has said predetermined dimensions defined by said diameter and said height;
    wherein no further tempering takes place after said removing of said edge regions; and
    whereby said alkali fluoride, alkaline earth fluoride or mixed fluoride crystal has an RMS value of refractive index uniformity ($\Delta n$) that is better than $0.025 \times 10^{-6}$ and a stress birefringence of less than 0.3 nm/cm.

2. The method as defined in claim 1, wherein said removing is such that said diameter reduction and said height reduction is at least ten percent respectively.

3. The method as defined in claim 1, wherein the crystal is a $CaF_2$ crystal.

4. The method as defined in claim 1, wherein the crystal in a (111)-orientation is vertically tempered.

5. The method as defined in claim 1, wherein the crystal is kept isothermally at least at a temperature above 1150° C.

6. The method as defined in claim 1, wherein a cooling rate during said cooling in a first temperature range, whose low temperature limit is between 900° C. to 600° C., is less than 0.5 K/hr.

7. The method as defined In claim 6, wherein said cooling rate is less than 0.4 K/hr.

8. The method as defined in claim 6, wherein said cooling rate is less than 0.3 K/hr.

9. The method as defined in claim 1, wherein a cooling rate during said cooling in a second temperature range, whose high temperature limit is between 900° C. to 600° C. and whose low temperature limit is room temperature, is less than 3 K/hr.

10. The method as defined in claim 9, wherein said cooling rate is less than 2 K/hr.

11. The method as defined in claim 9, wherein said cooling rate is less than 1.7 K/hr.

12. The method as defined in claim 1, further comprising transporting or transferring heat laterally during said tempering.

13. An alkali fluoride, alkaline earth fluoride or a mixed fluoride crystal having a stress birefringence less than 0.3 nm/cm and an RMS value of refractive index uniformity ($\Delta n$) that is better than $0.025 \times 10^{-6}$.

14. An optical element consisting of an alkali fluoride, alkaline earth fluoride or a mixed fluoride crystal, said crystal having a stress birefringence less than 0.3 nm/cm and an RMS value of refractive index uniformity ($\Delta n$) that is better than $0.025 \times 10^{-6}$.

15. A stepper, excimer laser, wafer, computer chip or integrated circuit containing an alkali fluoride, alkaline earth fluoride or a mixed fluoride crystal acting as an optical element, said crystal having a stress birefringence less than 0.3 nm/cm and an RMS value of refractive index uniformity ($\Delta n$) that is better than $0.025 \times 10^{-6}$.

16. An electronic unit or device, which contains a computer chip and/or an integrated circuit, wherein said computer chip and said integrated circuit each contain an alkali fluoride, alkaline earth fluoride or a mixed fluoride crystal acting as an optical element, said crystal having a stress birefringence less than 0.3 nm/cm and an RMS value of refractive index uniformity ($\Delta n$) that is better than $0.025 \times 10^{-6}$.

17. An alkali fluoride, alkaline earth fluoride or a mixed fluoride crystal having an RMS value of refractive index uniformity ($\Delta n$) that is better than $0.025 \times 10^{-6}$ and a stress birefringence that is less than 0.3 nm/cm and obtainable by a method comprising the steps of:
  a) growing the alkali fluoride, alkaline earth fluoride or mixed fluoride crystal from a melt, said crystal having larger dimensions than predetermined dimensions defined by a diameter and a height of the crystal;
  b) cooling the crystal with the larger dimensions obtained in step a);
  c) tempering the crystal with the larger dimensions obtained in step a); and
  d) after the cooling of step b) and the tempering of step c), removing edge regions of said crystal with the larger dimensions so that a diameter reduction and a height reduction of at least five percent occurs respectively and thus said crystal has said predetermined dimensions defined by said diameter and said height; and
  wherein no further tempering takes place after said removing of said edge regions.

18. An alkali metal or alkaline earth metal fluoride crystal for optical elements operating at ultraviolet wavelengths of 193 nm and 157 nm, said crystal having a diameter of at least 20 cm, an RMS value of refractive index uniformity ($\Delta n$) that is better than $0.025 \times 10^{-6}$ and a stress birefringence of less than 0.3 nm/cm.

19. The crystal as defined in claim 18, consisting of a calcium fluoride crystal in a 111-, 110- or 100-orientation.

20. A calcium fluoride crystal for optical elements operating at ultraviolet wavelengths of 193 nm and 157 nm, said crystal having a diameter or height of at least 20 cm, an RMS value of refractive index uniformity ($\Delta n$) that is better than $0.025 \times 10^{-6}$ and a stress birefringence of less than 0.3 nm/cm.

21. The crystal as defined in claim 13, consisting of a calcium fluoride crystal.

22. The crystal as defined in claim 14, consisting of a calcium fluoride crystal.

* * * * *